US00RE50181E

(19) United States
(12) Reissued Patent
Anderson et al.

(10) Patent Number: US RE50,181 E
(45) Date of Reissued Patent: *Oct. 22, 2024

(54) ISOLATION REGION FABRICATION FOR REPLACEMENT GATE PROCESSING

(71) Applicant: Samsung Electronics Co., Ltd., Suwon-si (KR)

(72) Inventors: Brent A. Anderson, Jericho, VT (US); Edward J. Nowak, Shelburne, VT (US)

(73) Assignee: SAMSUNG ELECTRONICS CO., LTD., Suwon-si (KR)

( * ) Notice: This patent is subject to a terminal disclaimer.

(21) Appl. No.: 17/209,199

(22) Filed: Mar. 22, 2021

Related U.S. Patent Documents

Reissue of:
(64) Patent No.: 8,643,109
Issued: Feb. 4, 2014
Appl. No.: 13/771,275
Filed: Feb. 20, 2013

U.S. Applications:
(60) Continuation of application No. 15/626,876, filed on Jun. 19, 2017, now Pat. No. Re. 48,616, which is a continuation of application No. 15/015,546, filed on Feb. 4, 2016, now Pat. No. Re. 46,448, which is an application for the reissue of Pat. No. 8,643,109,
(Continued)

(51) Int. Cl.

| | |
|---|---|
| ***H01L 27/12*** | (2006.01) |
| ***H01L 21/28*** | (2006.01) |
| ***H01L 21/762*** | (2006.01) |
| ***H01L 21/84*** | (2006.01) |
| ***H01L 29/66*** | (2006.01) |

(52) U.S. Cl.
CPC .. *H01L 29/66545* (2013.01); *H01L 21/28123* (2013.01); *H01L 21/76283* (2013.01); *H01L 21/84* (2013.01); *H01L 27/1203* (2013.01)

(58) Field of Classification Search
CPC ..... H01L 29/66545; H01L 21/28123; H01L 21/76283; H01L 21/84; H01L 27/1203; H01L 29/66; H01L 21/762
See application file for complete search history.

(56) References Cited

U.S. PATENT DOCUMENTS

| | | | |
|---|---|---|---|
| 6,803,278 | B2 | 10/2004 | Tran |
| 6,812,149 | B1 | 11/2004 | Wang et al. |
| 7,049,185 | B2 | 5/2006 | Ito |

(Continued)

FOREIGN PATENT DOCUMENTS

| | | | |
|---|---|---|---|
| JP | 2004-288685 | A | 10/2004 |
| JP | 2005-340461 | A | 12/2005 |

OTHER PUBLICATIONS

Hirose Shingo, JP2004288685, Oct. 14, 2004, Abstract.
Shinohara Tsuneo, JP2005340461, Dec. 8, 2005, Abstract.

*Primary Examiner* — Leonardo Andujar
(74) *Attorney, Agent, or Firm* — Muir Patent Law, PLLC

(57) ABSTRACT

A semiconductor structure includes a silicon-on-insulator (SOI) substrate, the SOI substrate comprising a bottom silicon layer, a buried oxide (BOX) layer, and a top silicon layer; a plurality of active devices formed on the top silicon layer; and an isolation region located between two of the active devices, wherein at least two of the plurality of active devices are electrically isolated from each other by the isolation region, and wherein the isolation region extends through the top silicon layer to the BOX layer.

11 Claims, 9 Drawing Sheets

AMENDED

Related U.S. Application Data which is a division of application No. 13/213,713, filed on Aug. 19, 2011, now Pat. No. 8,546,208.

(56) References Cited

U.S. PATENT DOCUMENTS 7,052,937 B2 5/2006 Clevenger
7,525,173 B2 4/2009 Yang et al.
7,569,887 B2 8/2009 Otsuki
7,671,469 B2 3/2010 Lee et al.
7,785,946 B2 8/2010 Haffner et al.
7,915,112 B2 3/2011 Xu et al.
8,502,316 B2 8/2013 Fung et al.
9,184,100 B2 11/2015 Tsai et al.
RE46,448 E * 6/2017 Anderson ..... H01L 27/1203
RE48,616 E * 6/2021 Anderson ..... H01L 27/1203
2005/0019993 A1 1/2005 Lee et al.
2005/0035415 A1* 2/2005 Yeo ..... H01L 29/66795 438/283
2005/0153490 A1* 7/2005 Yoon ..... H01L 29/66795 438/164
2005/0169052 A1 8/2005 Hsu et al.
2005/0239242 A1 10/2005 Zhu
2006/0125024 A1 6/2006 Ishigaki
2006/0228872 A1* 10/2006 Nguyen ..... H01L 29/66772 257/E21.415
2007/0176235 A1* 8/2007 Tsujiuchi et al. ..... 257/347
2007/0178660 A1* 8/2007 Miller et al. ..... 438/424
2008/0020515 A1* 1/2008 White et al. ..... 438/118
2008/0079074 A1* 4/2008 Icel et al. ..... 257/347
2008/0079088 A1 4/2008 Kudo
2008/0197424 A1 8/2008 Haensch
2009/0114995 A1 5/2009 Suzuki
2009/0200604 A1 8/2009 Chidambarrao et al.
2010/0148248 A1 6/2010 Mikasa
2010/0193877 A1 8/2010 Liaw et al.
2011/0147765 A1 6/2011 Huang et al.
2011/0287600 A1* 11/2011 Cheng ..... H01L 21/823425 257/E21.409

* cited by examiner

AMENDED

AMENDED

AMENDED

AMENDED

AMENDED

AMENDED

AMENDED

AMENDED

ISOLATION REGION FABRICATION FOR REPLACEMENT GATE PROCESSING

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATION

This application is *a continuation reissue application of U.S. patent application Ser. No. 15/626,876, filed Jun. 19, 2017, which is an application for reissue of U.S. Pat. No. 8,643,109, filed Feb. 20, 2013, and which is continuation reissue application of U.S. patent application Ser. No. 15/015,546, filed Feb. 4, 2016 and now U.S. Pat. No. RE46,448, which is an application for reissue of U.S. Pat. No. 8,643,109, filed Feb. 20, 2013, which patent was filed as* a divisional *application* of U.S. *patent* application Ser. No. 13/213,713, filed on Aug. 19, 2011, *now U.S. Pat. No. 8,546,208, the disclosure of each of* which is herein incorporated by reference in its entirety.

BACKGROUND

This disclosure relates generally to the field of integrated circuit (IC) manufacturing, and more specifically to isolation region fabrication for electrical isolation between semiconductor devices on an IC.

ICs are formed by connecting isolated active devices, which may include semiconductor devices such as field effect transistors (FETs), through specific electrical connection paths to form logic or memory circuits. Therefore, electrical isolation between active devices is important in IC fabrication. Isolation of FETs from one another is usually provided by shallow trench isolation (STI) regions located between active silicon islands. An STI region may be formed by forming a trench in the substrate between the active devices by etching, and then filling the trench with an insulating material, such as an oxide. After the STI trench is filled with the insulating material, the surface profile of the STI region may be planarized by, for example, chemical mechanical polishing (CMP).

However, use of raised (or regrown) source/drain structures, which may be employed to achieve lower series resistances of the IC or to strain FET channels, may exhibit significant growth non-uniformities at the boundary between a gate and an STI region, or when the opening in which the source/drain structure is formed is of variable dimensions. This results in increased variability in FET threshold voltage ($V_t$), delay, and leakage, which in turn degrades over-all product performance and power. One solution to such boundary non-uniformity is to require all STI regions to be bounded by isolation regions. However, inclusion of such isolation region structures may limit space available for wiring, device density, and increase the load capacitance, thereby increasing switching power of the IC.

BRIEF SUMMARY

In one aspect, a semiconductor structure includes a silicon-on-insulator (SOI) substrate, the SOI substrate comprising a bottom silicon layer, a buried oxide (BOX) layer, and a top silicon layer; a plurality of active devices formed on the top silicon layer; and an isolation region located between two of the active devices, wherein at least two of the plurality of active devices are electrically isolated from each other by the isolation region, and wherein the isolation region extends through the top silicon layer to the BOX layer.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE DRAWINGS

Referring now to the drawings wherein like elements are numbered alike in the several FIGURES.

DETAILED DESCRIPTION

Embodiments of a method for isolation region fabrication for replacement gate processing, and an IC including isolation regions, are provided, with exemplary embodiments being discussed below in detail. Instead of placing isolation regions at STI region boundaries, isolation regions may replace STI regions, as is described in U.S. patent application Ser. No. 12/951,575 (Anderson et al.), filed Nov. 22, 2010, which is herein incorporated by reference in its entirety. A relatively dense, low-capacitance IC may be formed by replacement gate (i.e., gate-last) processing through use of a block mask that selectively allows removal of active silicon in a gate opening to form an isolation region. The active silicon is removed in a manner that is self-aligned to the dummy gate, such that there is no overlap of gate to active area and hence minimal capacitance penalty.

Figure 1:
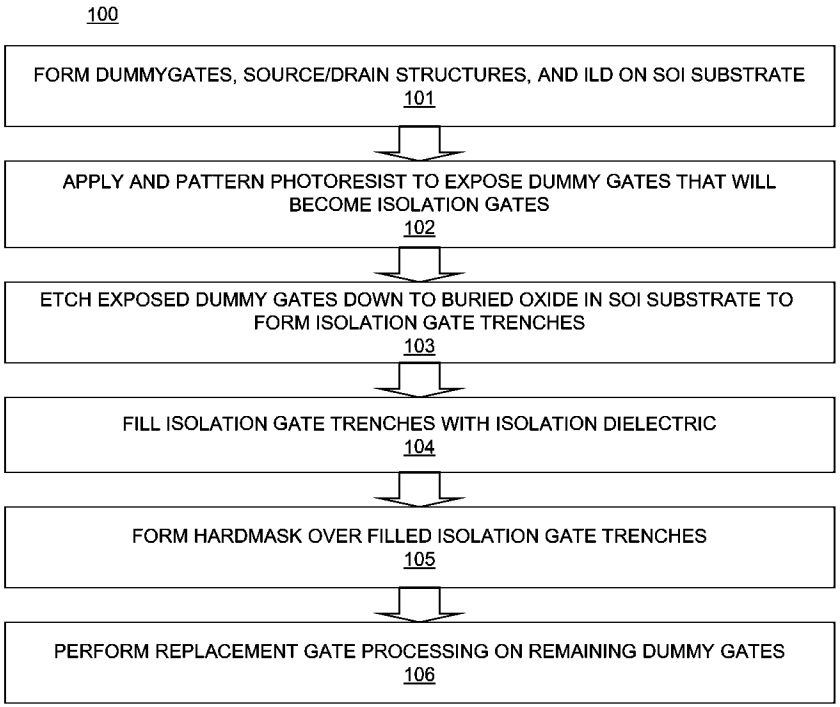
FIG. 1 illustrates a flowchart of an embodiment of a method of isolation region fabrication for replacement gate processing.
Figure 2A:
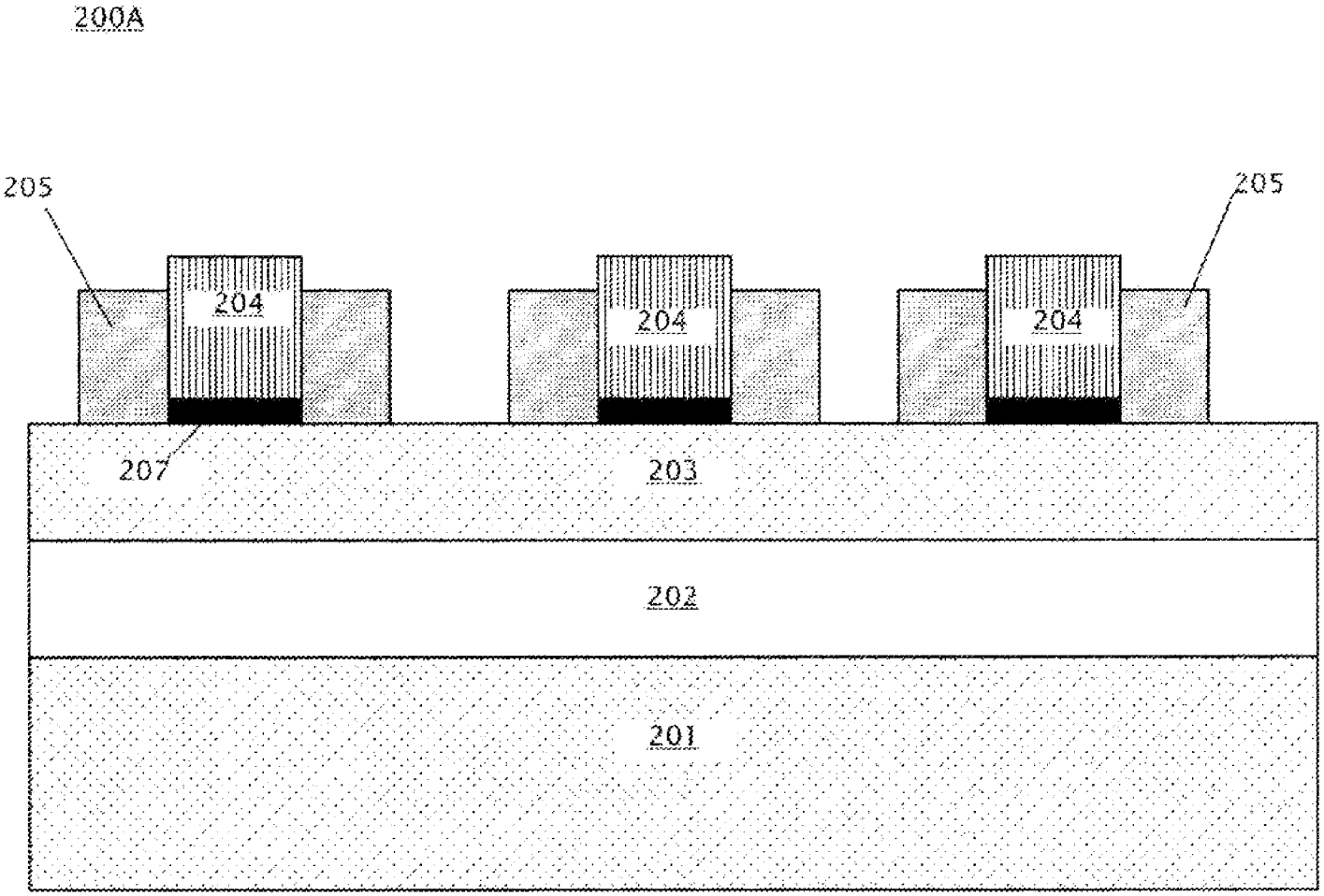
FIG. 2A is a cross sectional view illustrating an embodiment of a semiconductor structure including dummy gates on a silicon-on-insulator (SOI) substrate.
Figure 2B:
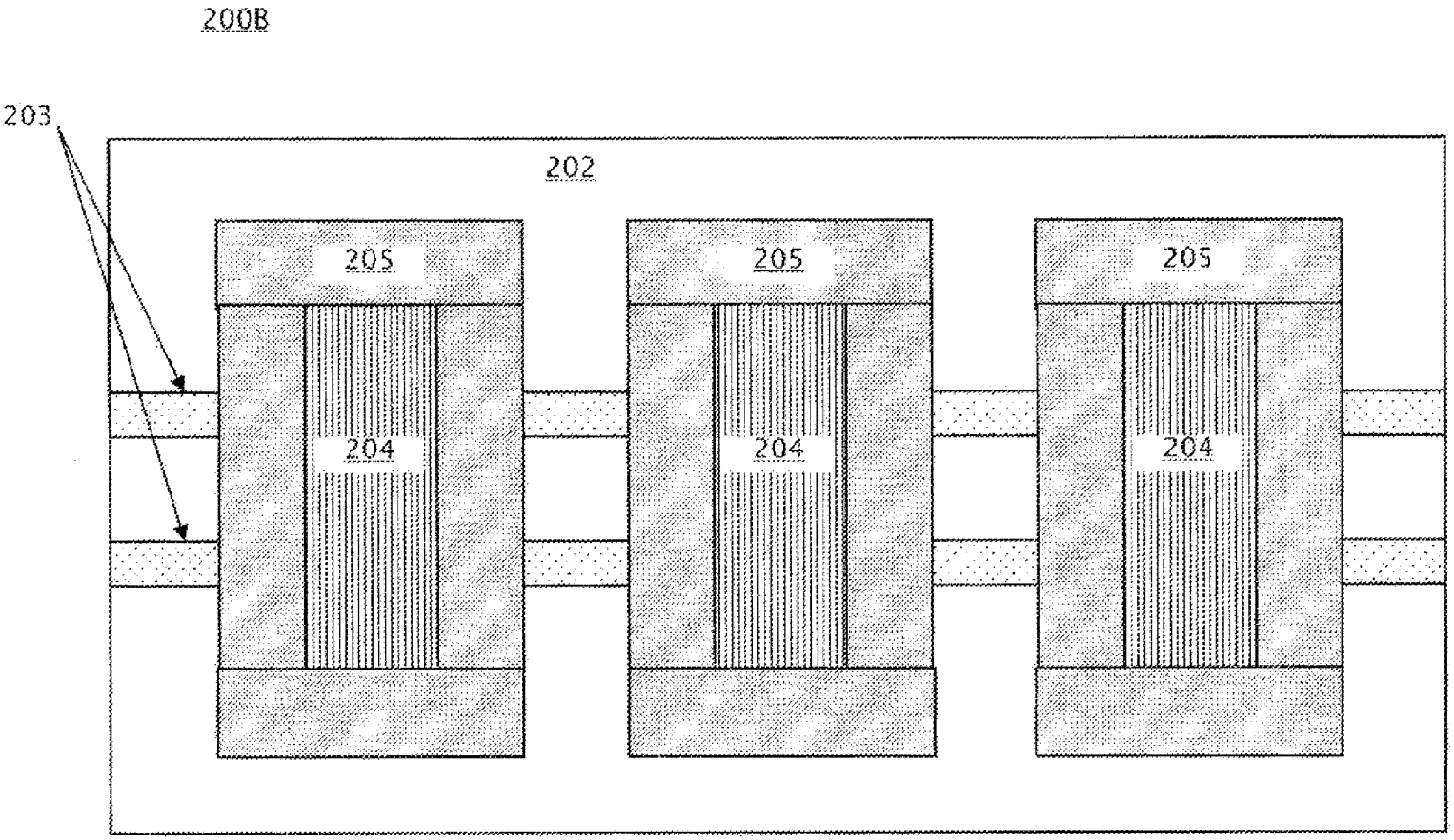
FIG. 2B is a top view illustrating an embodiment of the semiconductor structure of FIG. 2A that comprises fins for formation of fin field effect transistors (finFETs).
Figure 3:
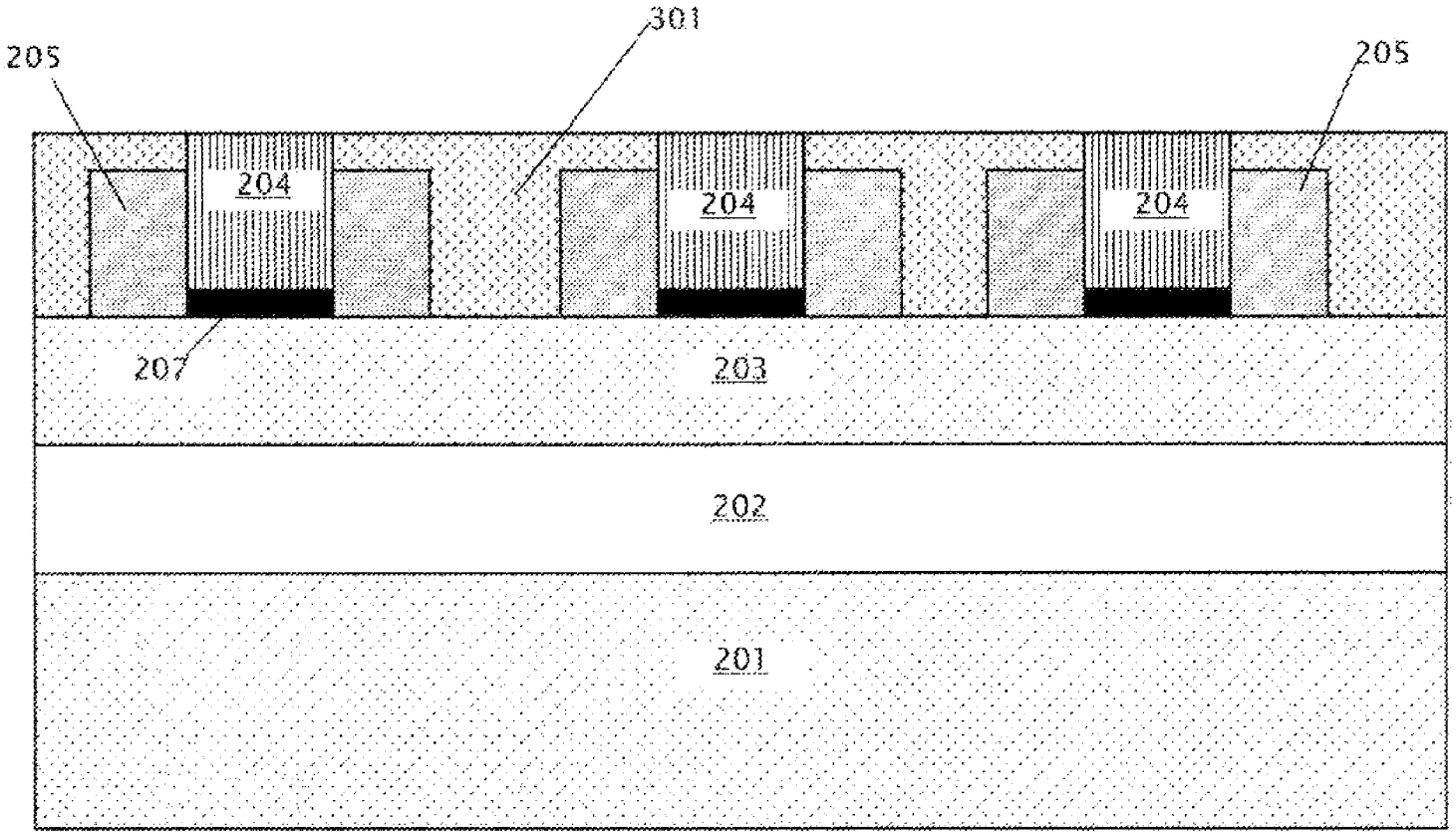
FIG. 3 is a cross sectional view illustrating the semiconductor structure of FIG. 2A after formation of an interlevel dielectric layer (ILD) over the dummy gates.

FIG. 1 shows a flowchart of an embodiment of a method 100 of isolation region fabrication for replacement gate processing. FIG. 1 is discussed with reference to FIGS. 2-7. First, in block 101 of FIG. 1, a semiconductor structure including dummy gates, source/drain regions, spacers, is formed on a substrate using regular semiconductor processing techniques, and an interlevel dielectric layer (ILD) is formed over the dummy gates. The semiconductor structure may also include raised source/drain regions located on either side of the dummy gates underneath the spacers [is] *in* some embodiments. The semiconductor structure may include any appropriate semiconductor structure that includes dummy gates, including but not limited to a fin field effect transistor (finFET) structure. An embodiment of such a semiconductor structure 200A is shown in FIG. 2A. The substrate is a silicon-on-insulator substrate, including bottom silicon layer 201, buried oxide (BOX) layer 202, and top silicon layer 203. Dummy gates 204 are located on top silicon layer 203. In some embodiments, a gate dielectric layer 207 is formed underneath each dummy gate 204. The dummy gate structure 204 may be polysilicon in some embodiments. The gate dielectric layer 207 may be any appropriate dielectric material, and in some embodiments may include a bottom dielectric layer and a top metal layer. Spacers 205 are formed on either side of the dummy gates 204. FIG. 2B shows a top view of an embodiment of the semiconductor structure 200A of FIG. 2A in which the top silicon layer 203 has been patterned to form fins for finFETs. In the semiconductor structure 200B of FIG. 2B, the dummy gates 204 wrap around and cover the fins that comprise top silicon layer 203. After formation of the dummy gates 204, as shown in FIG. 3, ILD 301 is formed over the dummy gates 204 and spacers 205, and ILD 301 is planarized such that the top surfaces of dummy gates 204 are exposed.

Figure 4:
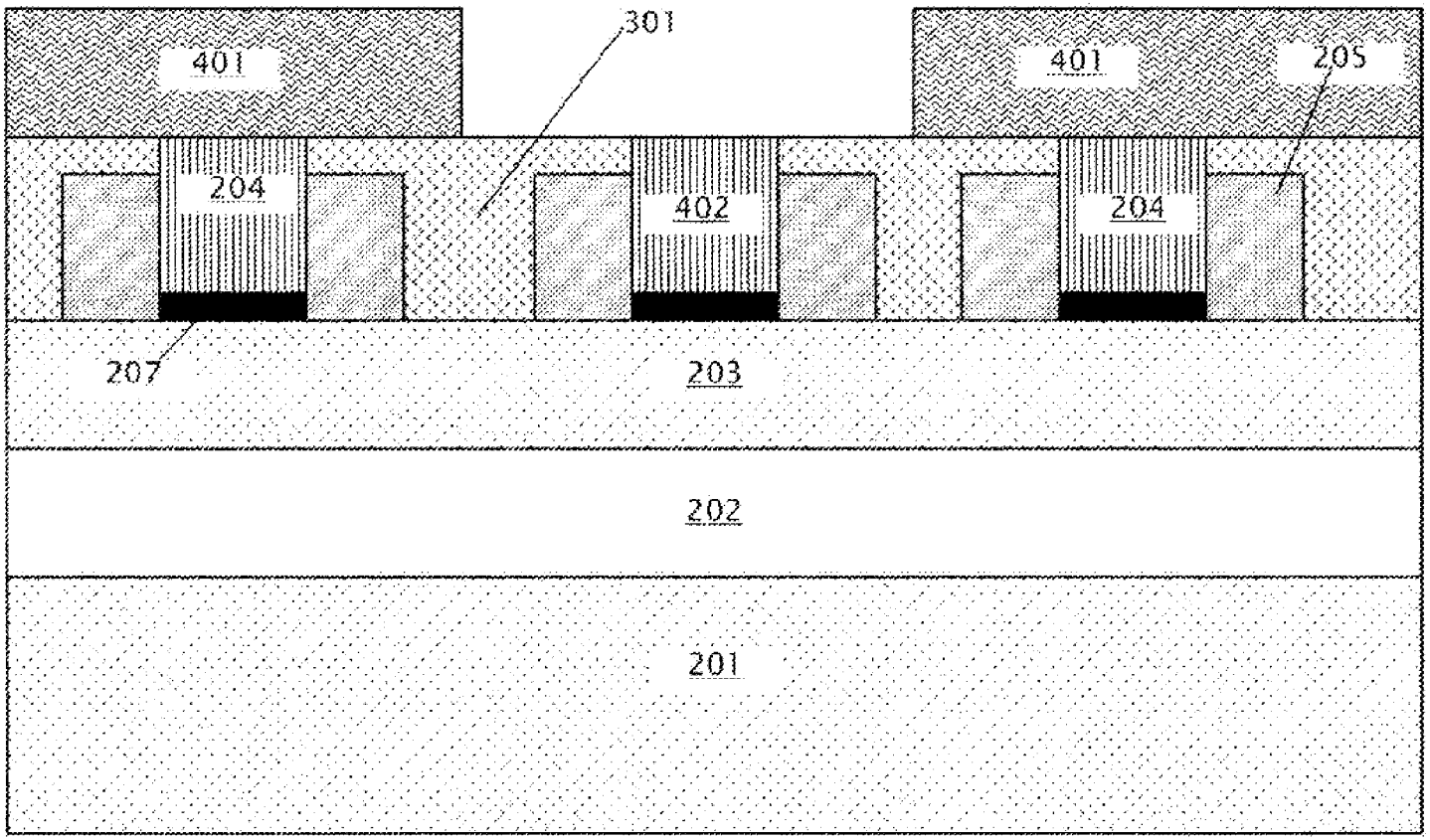
FIG. 4 is a cross sectional view illustrating the semiconductor structure of FIG. 3 after application and patterning of photoresist.
Figure 5:
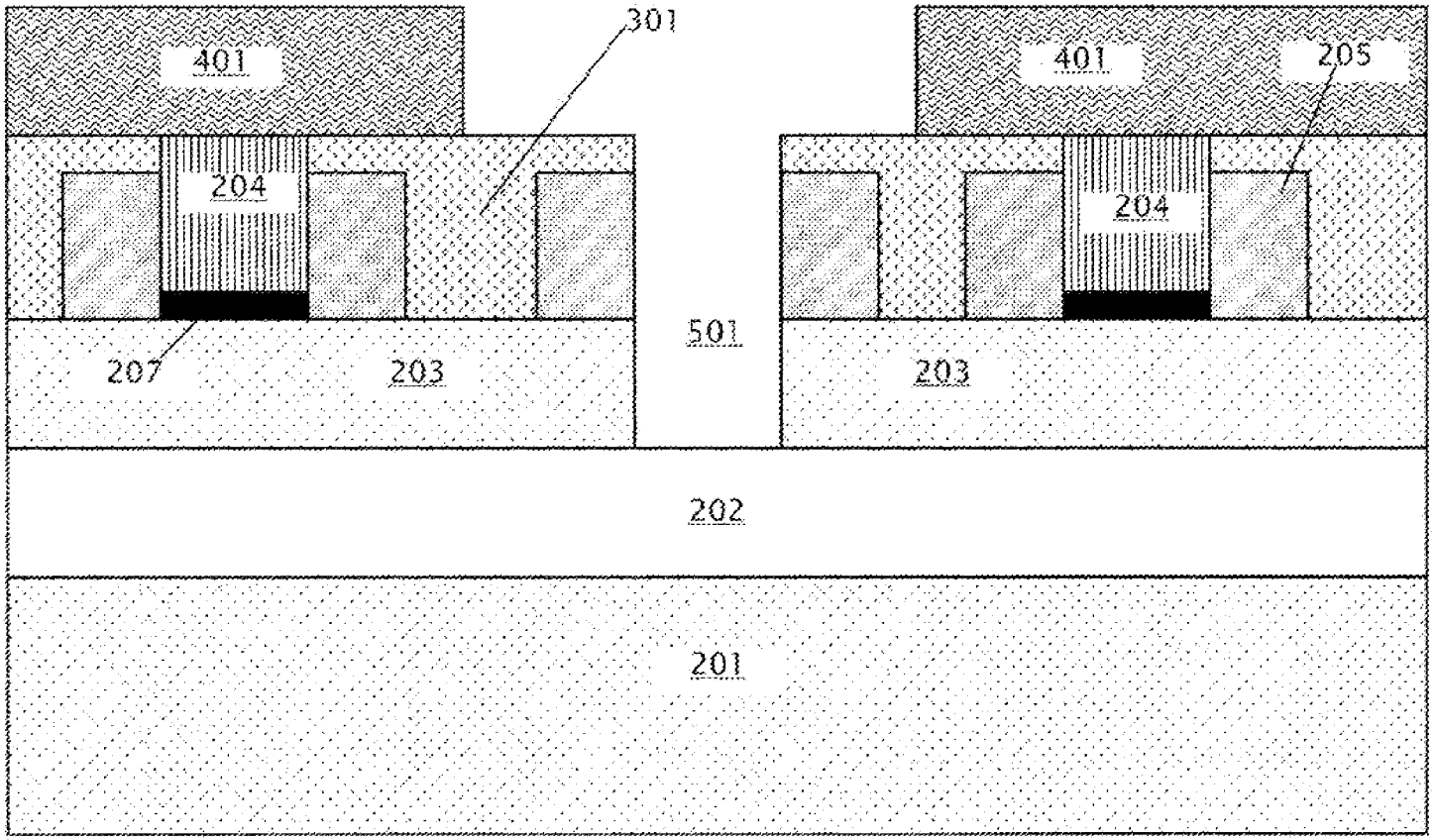
FIG. 5 is a cross sectional view illustrating the semiconductor structure of FIG. 3 after removal of an exposed dummy gate to form an isolation region trench.

Returning to method 100, in block 102, a block mask is applied to the top surface of the dummy gates and the ILD, and the block mask is patterned to selectively expose the dummy gates that are to become isolation regions. The block mask may comprise, for example, photoresist. FIG. 4 shows an embodiment of the semiconductor structure 200A after application and patterning of photoresist 401 to form the block mask, which exposes a dummy gate 402. Then, turning again to method 100, in block 103, the exposed dummy gate is removed, and the portion of the top silicon layer located underneath the removed dummy gate is etched down to the BOX layer to form an isolation region recess. FIG. 5 shows an embodiment of a device including an isolation region recess 501. The etch used to remove exposed dummy gate 402 and its respective gate dielectric layer 207, and to form the recess 501 in top silicon layer 203, may be a sequential multistage etch. The sequential multistage etch may have 3 or 4 different stages depending on the materials that make up dummy gate 204 and gate dielectric layer 207. In embodiments in which the dummy gate 402 is polysilicon, dummy gate 402 may be removed using a dry etch such as a bromine-based etch. The respective gate dielectric layer 207 may next be removed using a wet etch, such as a hydrofluoric etch for example. In embodiments in which respective gate dielectric layer 207 includes a bottom dielectric layer and a top metal layer, the etch to remove the gate dielectric layer 207 may be a 2-stage etch. Then, the recess 501 may be formed in the top silicon layer 203 using a dry etch such as a bromine-based etch to etch down to BOX layer 202.

Figure 6:
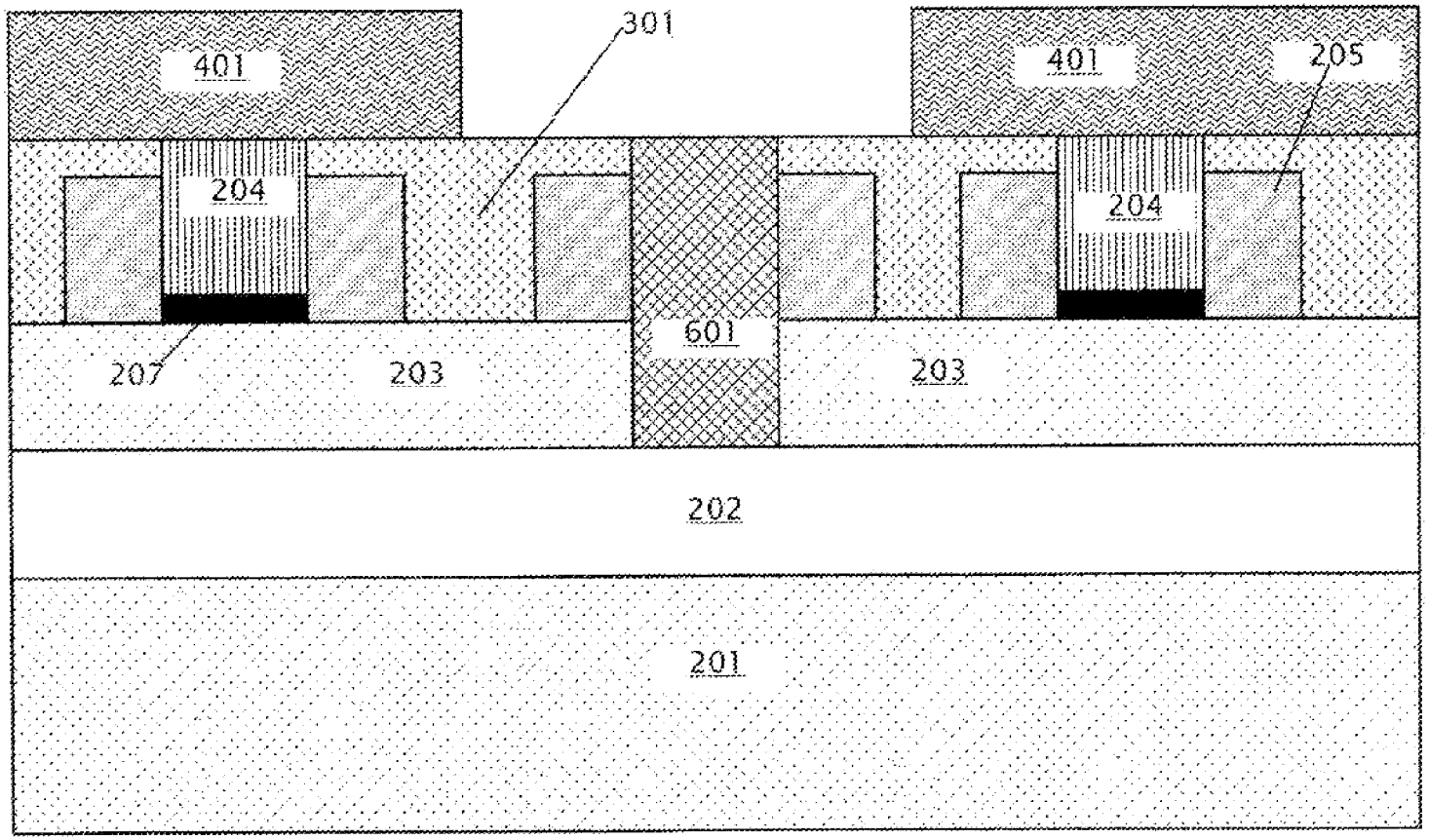
FIG. 6 is a cross sectional view illustrating the semiconductor structure of FIG. 4 after removal filling the isolation region trench with an isolation dielectric.
Figure 7:
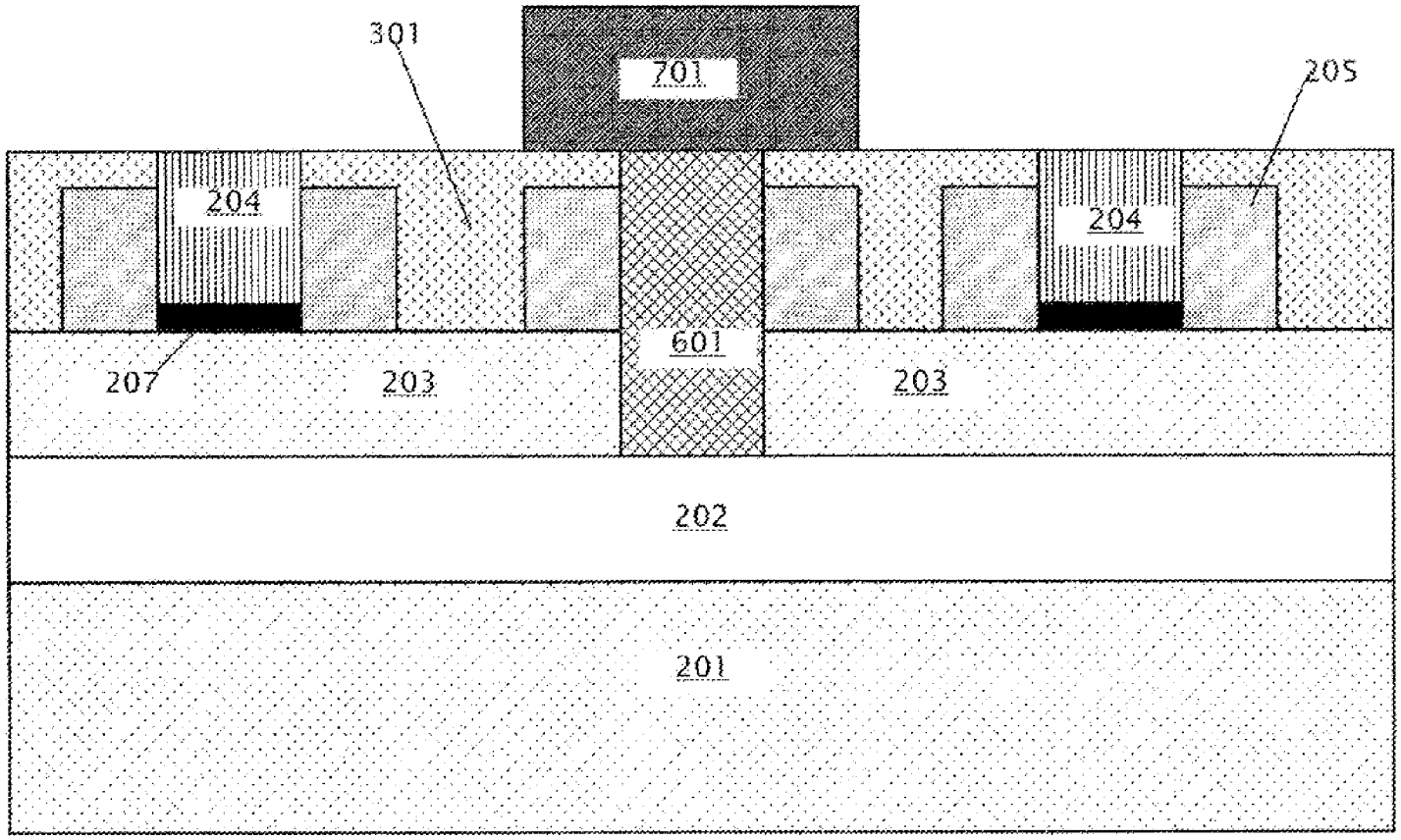
FIG. 7 is a cross sectional view illustrating the semiconductor structure of FIG. 5 after formation of a hardmask layer over the isolation region trench.
Figure 8:
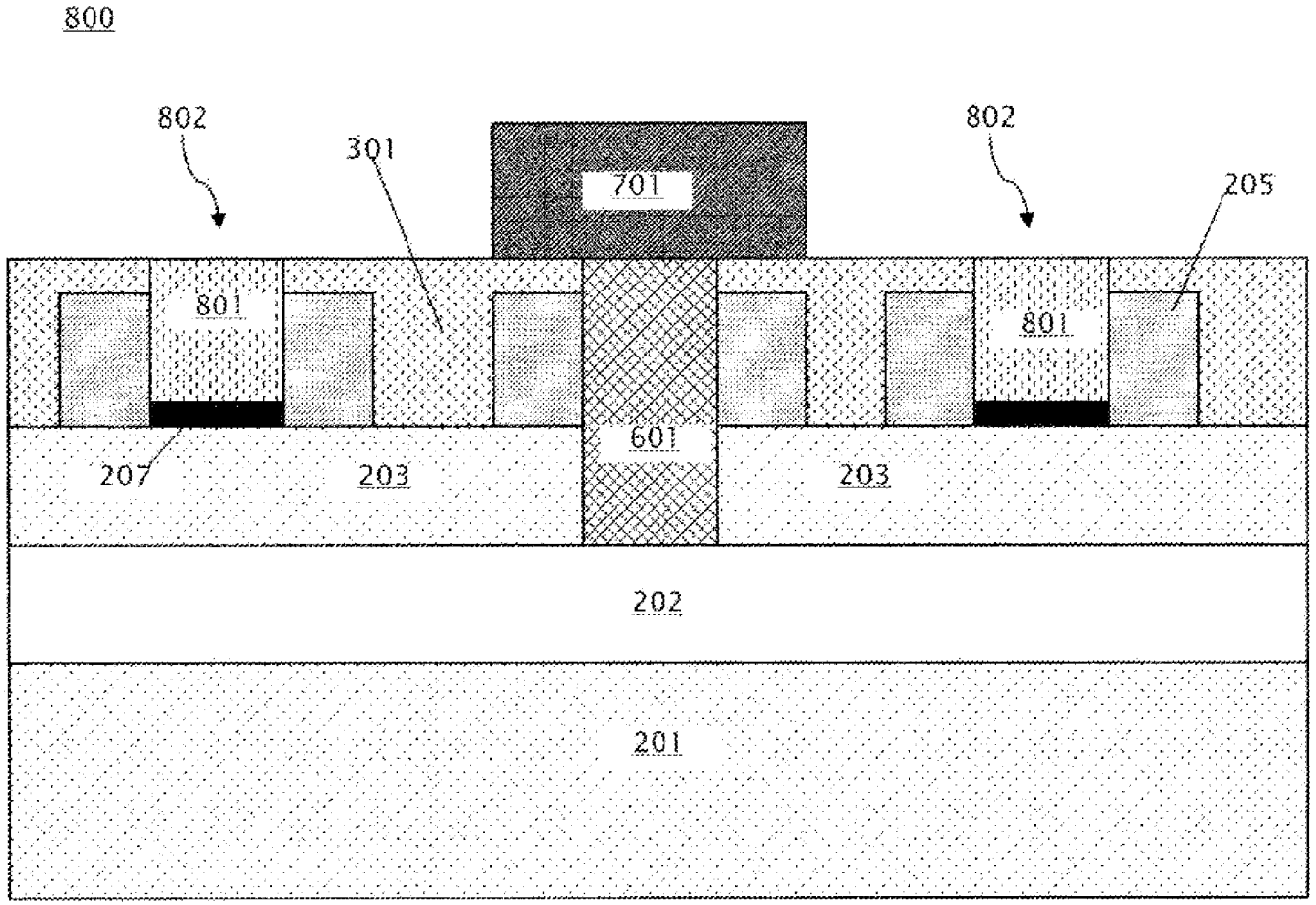
FIG. 8 is a cross sectional view illustrating the semiconductor structure of FIG. 6 after replacement gate processing.

Next, in method 100 of FIG. 1, in block 104, the recess that was formed during the etch performed in block 103 is filled with an insulating material to form the isolation region, and the top surface of the insulating material is planarized such as is shown in FIG. 6. In FIG. 6, the recess 501 is filled with an insulator, and the top surface of the insulator is planarized, to form isolation region 601. The insulator that comprises isolation region 601 may include silicon dioxide or silicon nitride in various embodiments. Then, flow of method 100 proceeds to block 105, in which a hardmask layer is formed over the isolation region and the photoresist is removed. FIG. 7 shows an embodiment of a hardmask layer 701 formed over the isolation region 601. The hardmask layer 701 may be silicon nitride. The photoresist 401 is also removed to expose the top surfaces of the remaining dummy gates 204.

Lastly, in block 106 of method 100 of FIG. 1, replacement gate processing is performed on the remaining dummy gates, resulting in an IC device including electrical devices separated by isolation regions. An example of an IC device 800 including an isolation region 601 between two active devices is shown in FIG. [7] *8*. Dummy gates 204 have been replaced with gate stacks 801 to form active FETs 802, including gate stacks 801, gate dielectric layer 207, spacers 205, and source/drain and channel regions located underneath the devices in the top silicon layer 203. The active FETs 802 may include raised source/drain regions (not shown) located under the spacers 205 in some embodiments. The active FETs 802 are separated by the isolation region 601, which extends down to BOX layer 202, preventing electrical leakage between active FETs 802. The hardmask layer 701 acts to protect the isolation region 601 during the replacement gate processing. The hardmask layer 701 may be left on the device 800 in some embodiments, or in other embodiments the hardmask layer 701 may be removed after replacement gate processing is completed. FIGS. 2A-8 are shown for illustrative purposes only; a device formed using method 100 may include any appropriate number, type, and layout of FETs separated by any appropriate number and layout of isolation regions. For example, in some embodiments, two active devices in a semiconductor structure may have two isolation regions located between the two active devices. Also, in some embodiments, the gate dielectric layer that is initially formed underneath the dummy gate may be replaced during the replacement gate processing. The finished active devices may comprise finFETs in some embodiments, or any other appropriate type of active device that may be formed by replacement gate processing in other embodiments.

The technical effects and benefits of exemplary embodiments include formation of an IC having relatively high device density and low capacitance through replacement gate processing.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

[1. A semiconductor structure, comprising:

a silicon-on-insulator (SOI) substrate, the SOI substrate comprising a bottom silicon layer, a buried oxide (BOX) layer, and a top silicon layer;

a plurality of active devices formed on the top silicon layer; and an isolation region located between two of the plurality of active devices, wherein at least two of the plurality of active devices are electrically isolated from each other by the isolation region, wherein the isolation region extends through the top silicon layer to the BOX layer, wherein the isolation region further extends between a pair of spacers that are located on the top silicon layer on either side of the isolation region, and wherein the isolation region further extends through an interlevel dielectric (ILD) layer that is located over the pair of spacers.]

[2. The semiconductor structure of claim 1, further comprising a hardmask layer located over the isolation region.]

[3. The semiconductor structure of claim 2, wherein the hardmask layer comprises silicon nitride.]

*4. A semiconductor device comprising:*

*a substrate including a top silicon layer that includes a fin;*

*a first gate structure disposed on the fin;*

*a second gate structure disposed on the fin;*

*an isolation region disposed between the first gate structure and the second gate structure, and electrically isolating the first gate structure from the second gate structure;*

*a first region disposed on a first side of the isolation region and disposed on the substrate;*

*a second region disposed on a second side of the isolation region and disposed on the substrate;*

*a third region including an interlevel dielectric (ILD) layer and including a first portion disposed on the first region and a second portion disposed on the second region; and*

*a silicon nitride layer disposed on the first region and the second region,*

*wherein the isolation region extends between the first region and the second region, and extends through the third region,*

*the isolation region extends from above a top of the fin to a bottom of the fin,*

*the fin extends in a first horizontal direction and at least the first gate structure extends in a second horizontal direction perpendicular to the first horizontal direction, and*

*wherein a top surface of the first gate structure is at substantially the same level as a top surface of the isolation region.*

*5. The semiconductor device of claim 4, wherein the third region includes a third portion disposed on the first gate structure and a fourth portion disposed on the second gate structure.*

*6. The semiconductor device of claim 4, wherein the silicon nitride layer is disposed on the isolation region.*

*7. The semiconductor device of claim 4, wherein the silicon nitride layer is disposed on the third region.*

*8. The semiconductor device of claim 4, wherein the isolation region extends through the third region in a direction that is substantially parallel with respect to a top surface of the substrate.*

*9. The semiconductor device of claim 4, wherein the isolation region extends through the third region in a direction that is substantially perpendicular with respect to a top surface of the substrate.*

*10. The semiconductor device of claim 4, wherein the third region is disposed on a sidewall of the first region and on a sidewall of the second region.*

*11. The semiconductor device of claim 4, wherein the third region is disposed on a top surface of the first region and on a top surface of the second region.*

*12. The semiconductor device of claim 4, wherein the isolation region contacts the third region.*

*13. The semiconductor device of claim 4, wherein the isolation region contacts the silicon nitride layer.*

*14. A semiconductor device comprising:*

*a substrate including a top silicon layer that includes a fin;*

*a first gate structure disposed on the fin;*

*a second gate structure disposed on the fin;*

*an isolation region disposed between the first gate structure and the second gate structure, and electrically isolating the first gate structure from the second gate structure;*

*a first region disposed on a first side of the isolation region and disposed on the substrate;*

*a second region disposed on a second side of the isolation region and disposed on the substrate;*

*a third region including a first portion disposed on the first region and a second portion disposed on the second region;*

*a silicon nitride layer disposed on the first region and the second region, disposed on the isolation region above the isolation region to vertically overlap the isolation region, and disposed adjacent to the third region;*

*a first channel disposed below the first gate structure; and*

*a second channel disposed below the second gate structure,*

*wherein the isolation region extends between the first region and the second region, and extends through the third region that is disposed on the first region and the second region.*

* * * * *